(12) United States Patent
Hooper et al.

(10) Patent No.: US 7,867,799 B2
(45) Date of Patent: Jan. 11, 2011

(54) MBE GROWTH OF A SEMICONDUCTOR LASER DIODE

(75) Inventors: Stewart Hooper, Oxfordshire (GB);
Valerie Bousquet, Oxford (GB);
Katherine L. Johnson, Oxford (GB);
Matthias Kauer, Oxford (DE);
Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 39 days.

(21) Appl. No.: 10/974,207

(22) Filed: Oct. 27, 2004

(65) Prior Publication Data

US 2005/0163179 A1 Jul. 28, 2005

(30) Foreign Application Priority Data

Oct. 28, 2003 (GB) ................ 0325098.2

(51) Int. Cl.
*H01L 21/00* (2006.01)
(52) U.S. Cl. ................. 438/46; 257/E21.097
(58) Field of Classification Search .......... 438/31, 438/46, 47; 257/E21.097
See application file for complete search history.

(56) References Cited

U.S. PATENT DOCUMENTS

| | | | |
|---|---|---|---|
| 5,513,199 A | 4/1996 | Haase et al. | |
| 5,777,350 A | 7/1998 | Nakamura et al. | |
| 5,786,269 A * | 7/1998 | Murakami et al. | 438/603 |
| 5,972,730 A | 10/1999 | Saito et al. | |
| 6,239,033 B1 * | 5/2001 | Kawai | 438/693 |
| 6,456,640 B1 | 9/2002 | Okumura | |
| 6,518,082 B1 * | 2/2003 | Kidoguchi et al. | 438/46 |
| 6,586,819 B2 | 7/2003 | Matsuoka | |
| 6,777,253 B2 * | 8/2004 | Ishibashi et al. | 438/22 |
| 6,891,268 B2 * | 5/2005 | Tomiya et al. | 257/744 |
| 6,912,236 B2 * | 6/2005 | Shimizu et al. | 372/43.01 |
| 7,183,569 B2 * | 2/2007 | Okumura | 257/14 |
| 2001/0010941 A1 * | 8/2001 | Morita | 438/46 |
| 2001/0040245 A1 * | 11/2001 | Kawai | 257/192 |
| 2002/0033521 A1 | 3/2002 | Matsuoka | |
| 2005/0095768 A1 * | 5/2005 | Tsuda et al. | 438/200 |
| 2005/0180485 A1 * | 8/2005 | Shimizu et al. | 372/75 |

FOREIGN PATENT DOCUMENTS

EP 1 182 697 2/2002

(Continued)

OTHER PUBLICATIONS

Shuji Nakamura et al.; "InGaN-Based Multi-Quantam-Well-Structure Laser Diodes"; Jpn. J. Appl. Phys.; 1996; vol. 35, pp. L74-L76.

(Continued)

*Primary Examiner*—Mark Prenty
(74) *Attorney, Agent, or Firm*—Renner, Otto, Boisselle & Sklar, LLP

(57) ABSTRACT

A method of fabricating a continuous wave semiconductor laser diode in the (Al,Ga,In)N materials system comprises: growing, in sequence, a first cladding region (4), a first optical guiding region (5), an active region (6), a second optical guiding region (7) and a second cladding region (8). Each of the first cladding region (4), the first optical guiding region (5), the active region (6), the second optical guiding region (7) and the second cladding region (8) is deposited by molecular beam epitaxy.

3 Claims, 6 Drawing Sheets

FOREIGN PATENT DOCUMENTS

| | | |
|---|---|---|
| JP | 09-232680 | 9/1997 |
| JP | 10-154851 | 6/1998 |
| JP | 11-274079 | 10/1999 |
| JP | 2000-072692 | 3/2000 |
| JP | 2002-145700 | 5/2002 |

OTHER PUBLICATIONS

M. Johnson et al.; "A Critical Comparison Between MOVPE and MBE Growth of III-V Nitride Semiconductor Materials for Opto-Electronic Device Applications"; Mat. Res. Soc. Proc.; 1999;, vol. 537; p. G5.10.

Chinese Office Action for corresponding Application No. 200410102390.X dated Jul. 28, 2006.

* cited by examiner

MBE GROWTH OF A SEMICONDUCTOR LASER DIODE

FIELD OF THE INVENTION

The present invention relates to growth of a semiconductor light-emitting device, and in particular to growth of a semiconductor light-emitting device in a nitride materials system such as, for example, the (Al,Ga,In)N materials system. The invention may be applied to growth of, for example, a semiconductor laser diode (LD).

BACKGROUND OF THE INVENTION

The (Al,Ga,In)N material system includes materials having the general formula $Al_xGa_yIn_{1-x-y}N$ where $0 \leq x \leq 1$ and $0 \leq y \leq 1$. In this application, a member of the (Al,Ga,In)N material system that has non-zero mole fractions of aluminium, gallium and indium will be referred to as AlGaInN, a member that has a zero aluminium mole fraction but that has non-zero mole fractions of gallium and indium will be referred to as InGaN, a member that has a zero indium mole fraction but that has non-zero mole fractions of gallium and aluminium will be referred to as AlGaN, and so on. There is currently considerable interest in fabricating semiconductor light-emitting devices in the (Al,Ga,In)N material system since devices fabricated in this system can emit light in the blue-violet wavelength range of the spectrum (corresponding to wavelengths in the range of approximately 380-450 nm).

Semiconductor light-emitting devices fabricated in the (Al,Ga,In)N materials system are described, for example, by S. Nakamura et al in "Jap. J. Appl. Phys." Vol. 35, pp L74-L76 (1996). They are also described in U.S. Pat. No. 5,777,350, which teaches use of the metal-organic chemical vapour deposition (MOCVD) growth technique to fabricate light-emitting devices in the (Al,Ga,In)N materials system. MOCVD (also known as metal-organic vapour phase epitaxy or MOVPE) takes place in an apparatus which is commonly at atmospheric pressure but sometimes at a slightly reduced pressure of typically about 10 kPa Ammonia and the species providing one or more Group III elements to be used in epitaxial growth are supplied substantially parallel to the surface of a substrate upon which epitaxial growth is to take place, thus forming a boundary layer adjacent to and flowing across the substrate surface. It is in this gaseous boundary layer that decomposition to form nitrogen and the other elements to be epitaxially deposited takes place so that the epitaxial growth is driven by gas phase equilibria.

Another known semiconductor growth technique is molecular beam epitaxy (MBE). In contrast to MOCVD, MBE is carried out in a high vacuum environment. In the case of MBE as applied to the (Al,In,Ga)N system, an ultra-high vacuum (UHV) environment, typically around $1 \times 10^{-3}$ Pa, is used. A nitrogen precursor is supplied to the MBE chamber by means of a supply conduit and species providing aluminium, gallium and/or indium, and possibly also a suitable dopant species, are supplied from appropriate sources within heated effusion cells fitted with controllable shutters to control the amounts of the species supplied into the MBE chamber during the epitaxial growth period. The shutter-control outlets from the effusion cells and the nitrogen supply conduit face the surface of the substrate upon which epitaxial growth is to take place. The nitrogen precursor and the species supplied from the effusion cells travel across the MBE chamber and reach the substrate where epitaxial growth takes place in a manner which is driven by the deposition kinetics.

ACKNOWLEDGEMENT OF THE PRIOR ART

The MBE growth process has been successfully applied to growth in many material systems. For example, U.S. Pat. No. 5,513,199 discloses MBE growth of laser devices in a II VI material system and having, for example, a CdZnSe active layer. However it has so far been difficult to apply the MBE growth technique to growth of nitride semiconductor materials, and the quality of GaN, InGaN and p-type nitride materials grown by MBE is generally low as reported by M. Johnson et al. in "Mat. Res. Soc. Proc." Vol. 537, G5.10. (1999). Thus, at present, the majority of growth of high quality nitride semiconductor layers is carried out using the MOCVD process. The MOCVD process allows growth to occur at a V/III ratio well in excess of 1000:1. The V/m ratio is the molar ratio of the group V element to the Group m element during the growth process. A high V/III ratio is preferable during the growth of a nitride semiconductor material, since this allows a higher substrate temperature to be used which in turn leads to a higher quality semiconductor layer.

At present, growing high quality nitride semiconductor layers by MBE is more difficult than growing such layers by MOCVD. There have been no known demonstrations or reports of an electrically-operating semiconductor laser diode fabricated from nitride semiconductors that has an emission wavelength in the blue-violet region of the spectrum and that is grown using molecular beam epitaxy. The principal difficulty is in supplying sufficient nitrogen during the growth process.

EP-A-1 182 697 describes fabrication of a semiconductor device in the (Al,Ga,In)N materials system. The document relates primarily to growth by the MOCVD technique, and contains a detailed description of suitable MOCVD growth conditions. The document does suggest that MBE could be an alternative growth method, but it gives no details as to how the semiconductor device could be grown by an MBE process.

U.S. Pat. No. 6,456,640, U.S. Pat. No. 5,972,730, and JP-A-2000 072 692 contain similar disclosures to EP-A-1 182 697. These documents relate to the growth of semiconductor devices (for example, a self-pulsation laser device in the case of U.S. Pat. No. 6,456,640) in the (Al,Ga,In)N materials system by MOCVD—they suggest MBE as a possible alternative growth method for the growth of semiconductor devices but contain no details of how the MBE process could be practically applied to growth of such devices.

SUMMARY OF THE INVENTION

A first aspect of the present invention provides a method of fabricating a semiconductor light-emitting device in the (Al,Ga,In)N materials system, the method comprising: growing over a substrate, in sequence, a first cladding region, a first optical guiding region, an active region, a second optical guiding region and a second cladding region; wherein the method comprises depositing each of the first cladding region, the first optical guiding region, the active region, the second optical guiding region and the second cladding region by molecular beam epitaxy using ammonia as the nitrogen precursor, wherein the substrate is a GaN substrate or a GaN template substrate; and wherein the step of growing the active region comprises growing a layer that includes indium.

In the method of the invention, each of the first cladding region, the first optical guiding region, the second optical guiding region and the second cladding region is grown by MBE using ammonia as the nitrogen precursor, and each comprises a material that is a member of the (Al,Ga,In)N materials system. The active region comprises one or more active layers, and the or each active layer of the active region is grown by MBE and comprises a material that is a member of the (Al,Ga,In)N materials system. At least one of the layers of the active region contains indium.

The invention makes possible the use of the MBE growth technique, as an alternative to MOCVD, to fabricate a semiconductor light-emitting device, for example a continuous wave laser diode, which has an emission wavelength in the blue-violet region of the spectrum. Using MBE growth instead of MOCVD growth gives the following advantages:
i) significantly lower consumption of source materials such as ammonia and hydrogen when MBE is used;
ii) fewer impurities in the device, since MBE is an UHV process;
iii) thermal activation of the p-type dopant (usually magnesium) is not necessary in a device grown by MBE. In devices grown by MOCVD, however, hydrogen has to be thermally annealed out of magnesium-doped semiconductor layers to activate p-type conduction;
iv) MBE is more environmentally friendly than MOCVD.

The first cladding region may be grown over a first portion of a surface of a substrate, and the method may comprise depositing a first electrode over a second portion of the surface of the substrate.

The first cladding region may be grown over a first surface of a substrate, and the method may comprise depositing a first electrode over a second surface of the substrate.

The method may comprise depositing a second electrode over the second cladding region.

The device may be a semiconductor laser diode, and it may be a continuous wave laser diode. A continuous wave laser diode is a laser diode that emits laser light with an intensity that is substantially constant over time when a constant drive current (that exceeds the current threshold for laser oscillation) is applied—although a continuous wave laser can if desired be operated using a drive current of varying magnitude so as to provide an output intensity that varies over time. In contrast, a self-pulsation laser such as that disclosed in U.S. Pat. No. 6,456,640 has an optical output that varies between a high intensity and a low (or zero) intensity when a constant drive current is applied.

A second aspect of the invention provides a semiconductor light-emitting device manufactured by a method of the first aspect.

BRIEF DESCRIPTION OF THE DRAWINGS

Preferred features of the present invention will now be described by way of illustrative example with reference to the accompanying figures in which.

Like references denote like components throughout the drawings.

DETAILED DESCRIPTION OF THE PREFERRED EMBODIMENTS

Figure 1:
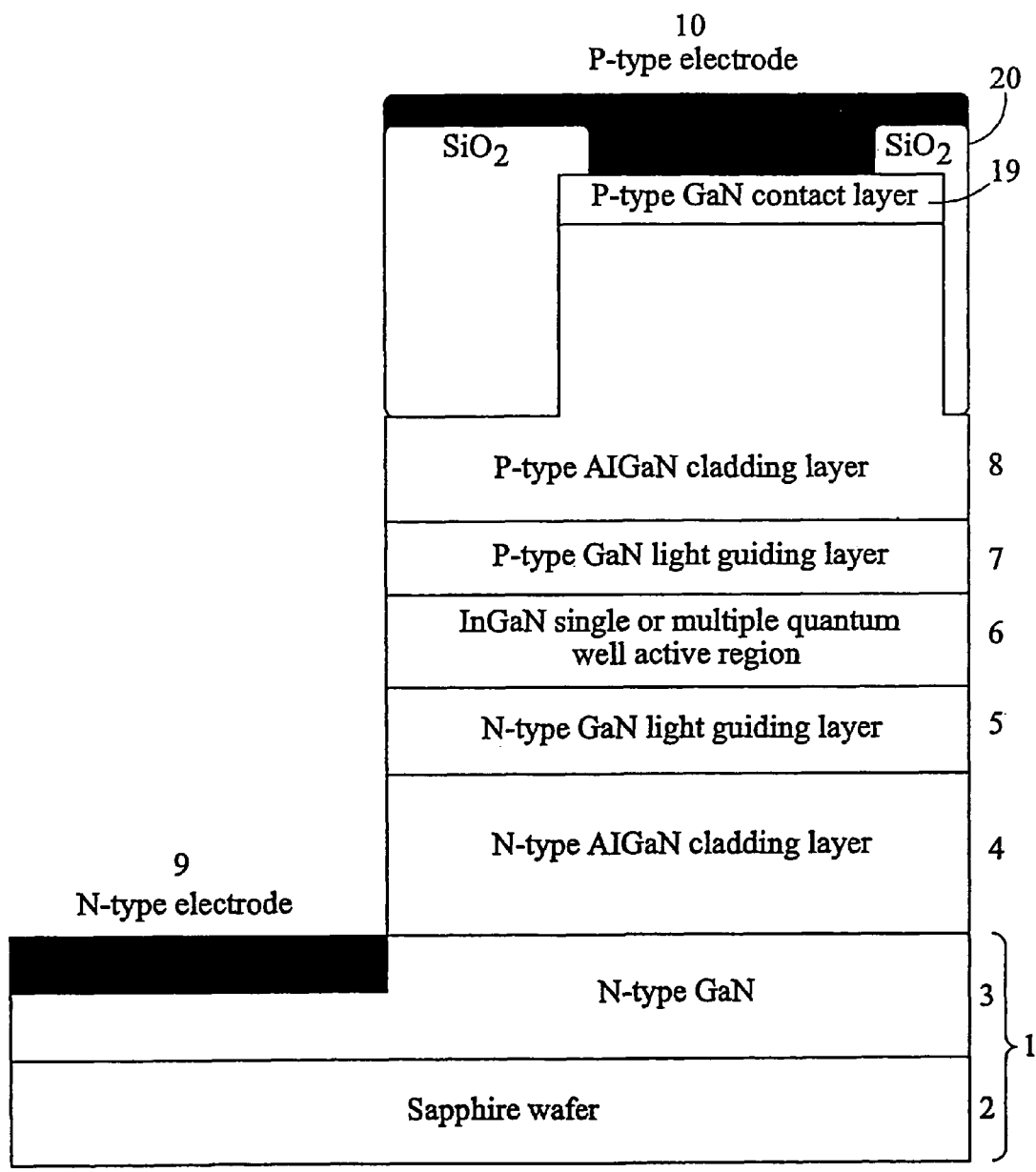
FIG. 1 is a schematic sectional view of the general structure of a semiconductor laser diode fabricated in the (Al,Ga,In)N system by MBE.

FIG. 1 is a schematic sectional view of an electrically-operable continuous wave semiconductor laser diode fabricated in the (Al,Ga,In)N materials system. The laser diode of FIG. 1 contains a plurality of layers deposited over a substrate 1 by the MBE method to form a p-n junction. The substrate is either a GaN substrate or a GaN "template substrate" which consists of a layer of GaN grown over a base substrate. In this example the substrate 1 is a "template substrate" and consists of a layer of n-type doped GaN 3 on a sapphire wafer 2.

As shown in FIG. 1, the layers deposited over the substrate 1 include a first cladding region formed of a cladding layer 4 of a first conductivity type and a second cladding region formed of a cladding layer 8 of a second conductivity type different from the first conductivity type. In this example the cladding layers 4, 8 are AlGaN layers, and the first cladding layer 4 is doped n-type and the second cladding layer 8 is doped p-type. An optical guiding region 5,7 is provided between the first cladding layer 4 and the second cladding layer 8. In this example the optical guiding region comprises a first optical guiding region 5 disposed on the first cladding layer and having the same conductivity type as the first cladding layer and a second optical guiding region 7 on which the second cladding layer 8 is disposed and having the same conductivity type as the second cladding layer 8. In this example the first and second optical guiding regions 5, 7 are each formed by an appropriately-doped GaN optical guiding layer.

An active region 6 formed of one or more (Al,Ga,In)N layers is positioned within the optical guiding region, between the first optical guiding region 5 and the second optical guiding region 7. At least one of the layers of the active region contains indium. The active region may be, for example, an InGaN single or multiple quantum well active region.

Electrical energy is coupled to the laser diode by first and second electrodes 9,10. The first electrode 9 is disposed on the same face of the substrate 1 as the first cladding layer 4—the first cladding layer does not cover the entire face of the substrate. The second electrode 10 is disposed over the stack of layers—in FIG. 1 a contact layer 19 is disposed over the second cladding layer 8, and the second electrode 10 is deposited on the contact layer 19 through a window opening in an insulating $SiO_2$ layer 20 deposited on the contact layer 19.

Figure 2:
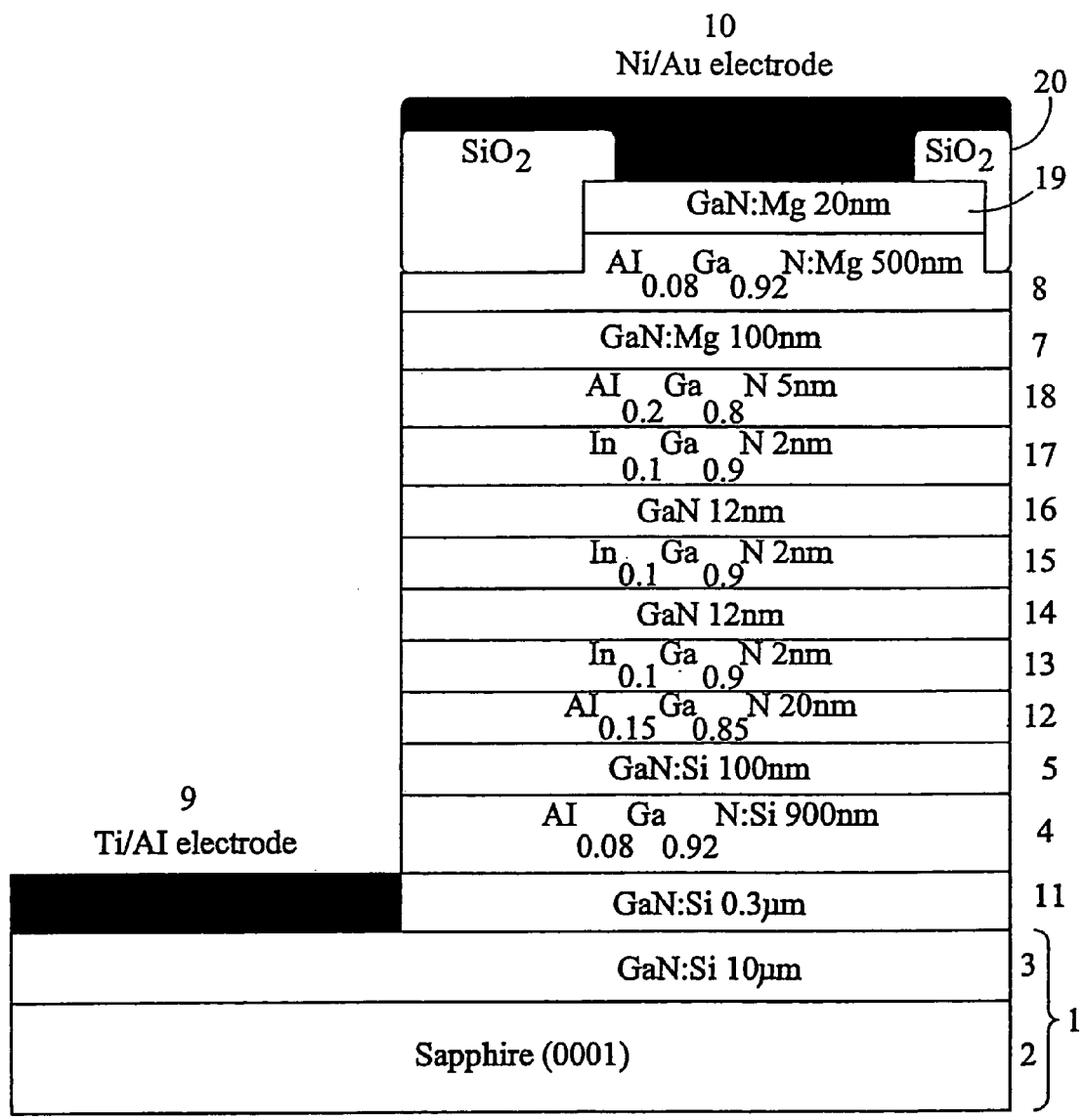
FIG. 2 is a schematic sectional view of a semiconductor laser diode fabricated in the (Al,Ga,In)N system by MBE.

FIG. 2 is a schematic sectional view of an actual continuous wave laser diode structure. This laser diode was fabricated by MBE over a commercially available "template substrate" 1 consisting of a 9-10 µm thick layer 3 of silicon-doped GaN deposited by MOCVD onto a sapphire wafer 2. A plurality of layers were then grown over the substrate 1 by MBE, and the layers grown by MBE were as follows:
i) Si doped GaN layer 11, 0.3 µm thick;
ii) Si doped $Al_{0.08}Ga_{0.92}N$ cladding layer 4, 0.9 µm thick;
iii) Si doped GaN optical guiding layer 5, 0.1 µM thick;
iv) Undoped $Al_{0.15}Ga_{0.85}N$ active region lower barrier layer 12, 20 nm thick;
v) Undoped $In_{0.1}Ga_{0.9}N$ quantum well layer 13, 2 nm thick;
vi) Undoped GaN barrier layer 14, 12 nm thick;
vii) Undoped $In_{0.1}Ga_{0.9}N$ quantum well layer 15, 2 nm thick;
viii) Undoped GaN barrier layer 16, 12 nm thick;
ix) Undoped $In_{0.1}Ga_{0.9}N$ quantum well layer 17, 2 nm thick;
x) Undoped $Al_{0.2}Ga_{0.8}N$ active region upper barrier layer 18, 5 nm thick;
xi) Mg doped GaN optical guiding layer 7, 0.1 µm thick;

xii) Mg doped $Al_{0.08}Ga_{0.92}N$ cladding layer 8, 0.5 µm thick; and xiii) Mg doped GaN contact layer 19, 20 nm thick The GaN layer 11 (layer (i) above) is a buffer layer. It is provided to bury any residual contamination that might exist on the surface of the substrate 1.

The active region of the laser diode is constituted by the active region, lower barrier layer 12, the quantum well layers 13, 15, 17, the barrier layers 14, 16, and the active region upper barrier layer 18 (that is, the active region is constituted by layers (iv) to (x)). These layers were not intentionally doped.

Each of the layers (i) to (xiii) above was grown by MBE. Ammonia was used as the group V nitrogen source, and elemental aluminium, gallium and indium were used as the group III sources. In growth of a doped layer, elemental silicon was used as an n-type dopant and bis(cylopentadienyl) magnesium ($Cp_2Mg$) was used as a p-type dopant.

The GaN buffer layer 11, the first cladding layer and the first optical guiding layer 5 (ie, layers (i)-(iii) above) were grown at an MBE growth temperature of 900° C. The layers 12-18 forming the active region (ie, layers (iv)-(x) above) were grown at an MBE growth temperature of 630° C. The second optical guiding layer 7, the second cladding layer 8, and the contact layer 19 (ie, layers (xi)-(xiii) above) were grown at an MBE growth temperature of 970° C.

The structure was annealed immediately after the deposition of each of the active region lower barrier layer 12, the barrier layers 14, 16, and the active region upper barrier layer 18. The temperature of the annealing step carried out immediately after deposition of the active region lower barrier layer 12 was 890° C., the temperature of the annealing step carried out immediately after deposition of the barrier layers 14,16 was 920° C., and the temperature of the annealing step carried out immediately after deposition of the active region upper barrier layer 18 was 970° C. A more detailed description of the annealing steps is given in co-pending UK patent application No. 0325099.0.

The semiconductor layers, down to and including the n-type GaN layer 11 disposed on the substrate 1, were then etched to form a mesa, as shown in FIG. 2. Part of the surface of the GaN layer 3 of the substrate 1 was exposed in this etching step. The contact layer 19 and the second cladding layer 8 were then etched in a second etching step to form a ridge-stripe structure in the second cladding layer 8 so as to define a ridge waveguide. The etching steps were performed using conventional photolithography and dry chemical etching. The mesa was 300 µm wide and 1 mm long (with the length direction extending into/out of the plane of the paper in FIG. 2), and the ridge waveguide was 5 µm wide and 1 mm long. The laser facets were formed using a combination of dry and wet chemical etching.

An Ni—Au electrode 10 was formed on the upper p-type GaN contact layer 19 through a window opening in an insulating $SiO_2$ layer 20 deposited on the contact layer 19. A Ti/Al electrode 9 was deposited onto the part of the GaN layer 3 of the substrate that was exposed in the step of etching the semiconductor layers to form the mesa—thus, this contact is deposited at one side of the mesa. It is possible to make electrical contact to the active region of the laser diode via the two electrodes 9, 10.

The laser diode of FIG. 2 has an emission wavelength in the wavelength range of from approximately 380 nm to approximately 450 nm, depending on the exact composition of the layers of the active region Thus, the invention makes possible fabrication by MBE of a continuous wave laser diode that has an emission wavelength in the wavelength range of from approximately 390 nm to approximately 410 nm, which will be the wavelength of the Blu-ray DVD standard.

Further details of the laser diode structure of FIG. 2, such as preferred composition ranges for semiconductors layers of the laser diode, are disclosed in co-pending UK patent application No. 0325100.6, the contents of which are hereby incorporated by reference.

Figure 3:
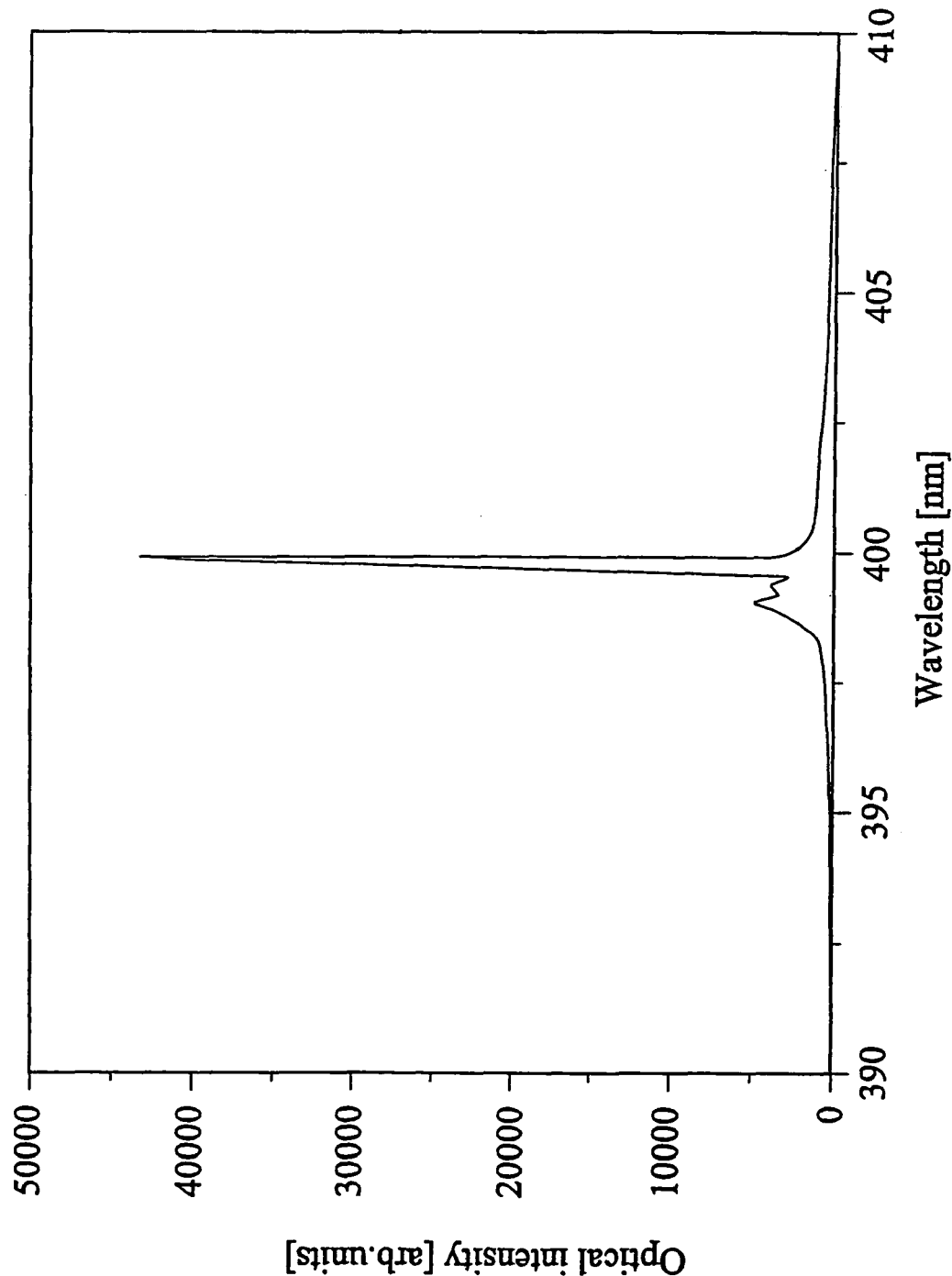
FIG. 3 illustrates the stimulated emission spectrum of the laser diode of FIG. 2.

FIG. 3 shows the stimulated emission spectrum from the laser diode of FIG. 2. FIG. 3 shows the intensity (in arbitrary units) of the optical output from the laser as a function of wavelength. The laser diode was lasing at room temperature under pulsed current conditions for these measurements. The full width at half maximum intensity of the optical emission peak at a wavelength just below 400 nm was less than 0.2 nm, which shows that the diode is lasing.

Figure 4:
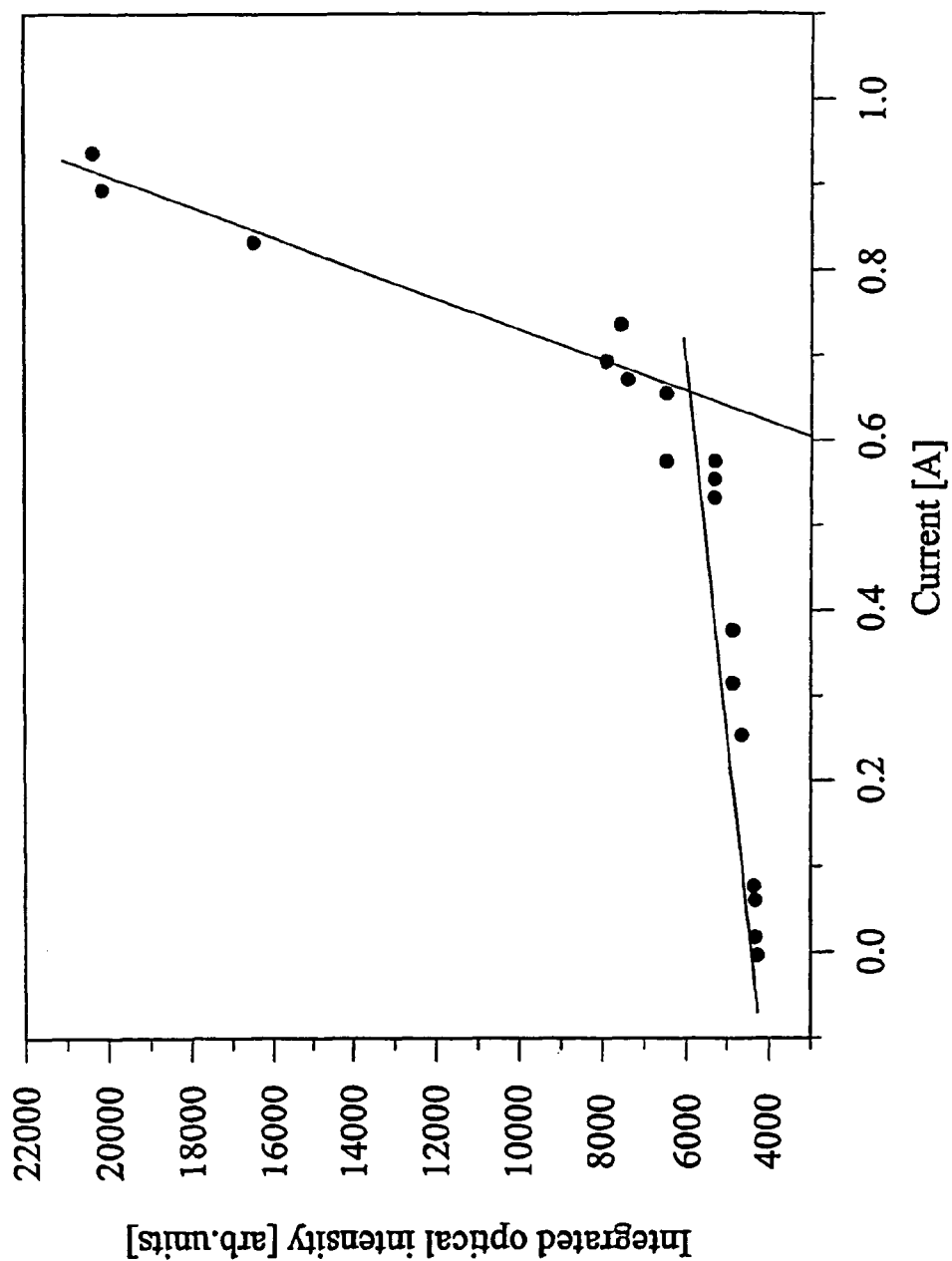
FIG. 4 illustrates the optical power output of the laser diode of FIG. 2.

FIG. 4 shows the characteristic curve of optical output intensity (in arbitrary units) against the applied current for the laser diode of FIG. 2. It can be seen that there is a clear kink in the output intensity at an applied current of approximately 0.6 A, and this indicates the onset of lasing—i.e. the threshold current for laser operation was approximately 0.6 A. At applied currents below 0.6 A lasing does not occur and the diode operates as a non-lasing light-emitting diode. The curve of FIG. 4 was again acquired at room temperature under pulsed current conditions.

Figure 5:
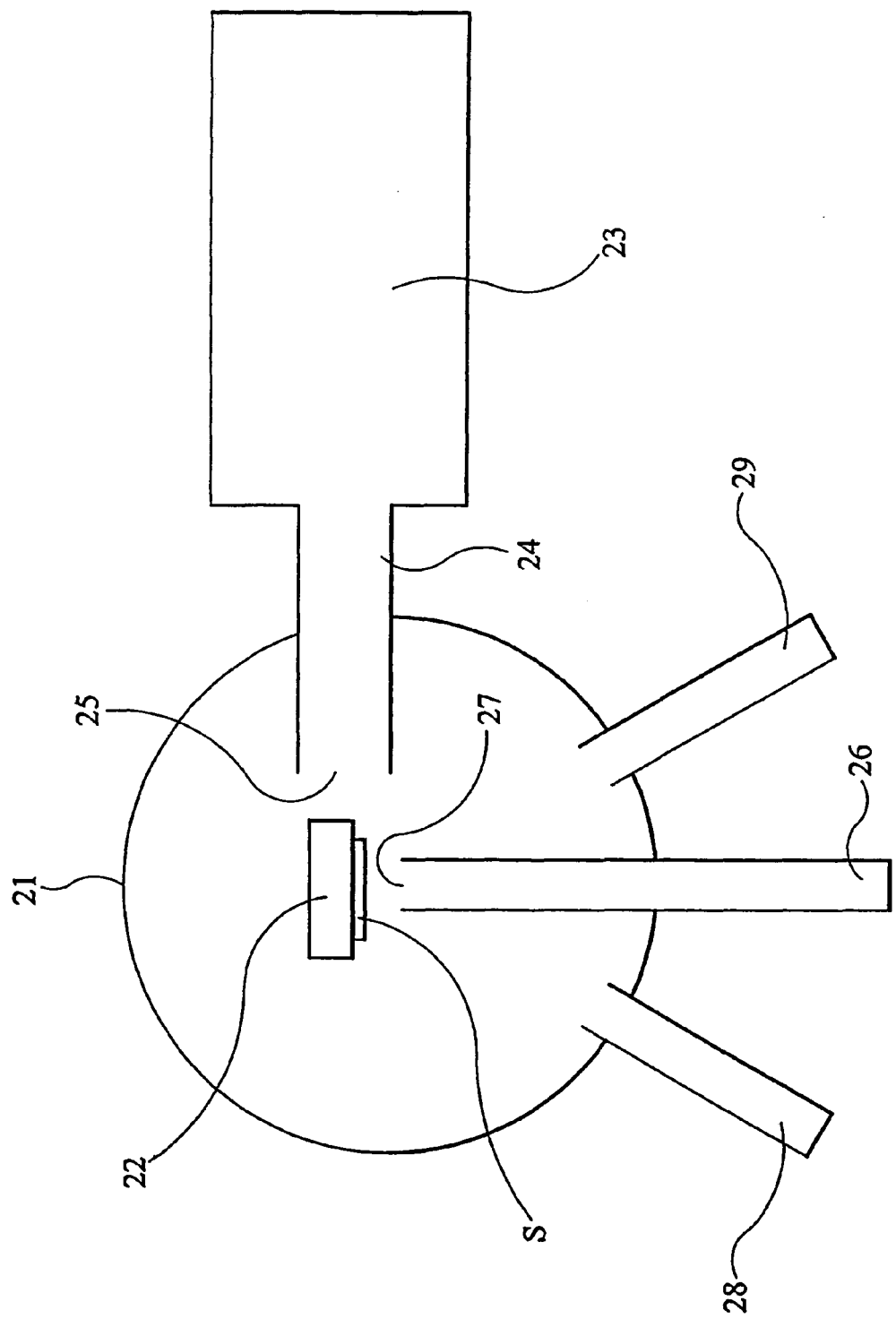
FIG. 5 is a schematic view of an MBE apparatus suitable for effecting the invention.

FIG. 5 is a schematic view of an apparatus suitable for the growth of a laser diode in a nitride semiconductor materials system by molecular beam epitaxy according to a method of the present invention. The apparatus comprises a growth chamber 21 in which is disposed a heated support 22 arranged to support and heat a substrate S. The growth chamber 21 is connected with an ultra-high vacuum pump 23 via an exhaust conduit 24 which extends into the growth chamber 21. The inner end of the exhaust conduit 24 defines a vacuum outlet 25 of the growth chamber 10. The vacuum outlet 25 is disposed adjacent to the substrate support 22.

The growth chamber 21 is further provided with a first supply conduit 26 which extends into the growth chamber so that an outlet 27 of the first supply conduit 26 is adjacent to and faces the surface of the substrate S upon which epitaxial growth is to take place. The first supply conduit 26 can be adjustably mounted relative to the chamber so that the relatively small distance between the outlet 27 of the first supply conduit 26 and the epitaxial growth surface of the substrate S can be varied during the epitaxial growth process. The longitudinal axis of the first supply conduit 26 is substantially perpendicular to the plane of epitaxial growth.

The first supply conduit 26 is used to supply ammonia which is the precursor of the nitrogen required in the epitaxial growth process. Because the outlet 27 of the first supply conduit 26 is positioned relatively close to the substrate S, a relatively high ammonia vapour pressure is localised at the surface of the epitaxially growing material while still enabling an ultra-high vacuum environment within the growth chamber 21 to be achieved by the pump 23. The high ammonia vapour pressure enables a high V/III ratio to be realised during the growth process.

The apparatus further comprises independently operable, shutter-controlled effusion cells 28, 29 (two such cells are shown in FIG. 5, although more effusion cells will be provided in practice) which contain sources of elemental indium, gallium and aluminium for the epitaxial growth process. The effusion cells 28 and 29 are conventionally positioned and define second and further supply conduits respectively. Additional effusion cells may be provided to supply, for example, dopant species during the growth process.

A MBE apparatus of the type described above is described in European Patent Application No. 98301842.5/0 864 672, the contents of which are hereby incorporated by reference. It should be noted, however, that the present invention is not limited to a MBE apparatus of the type described in European Patent Application No. 98301842.5, but may be carried out in any MBE growth apparatus that can provide the required V/III ratio.

Figure 6:
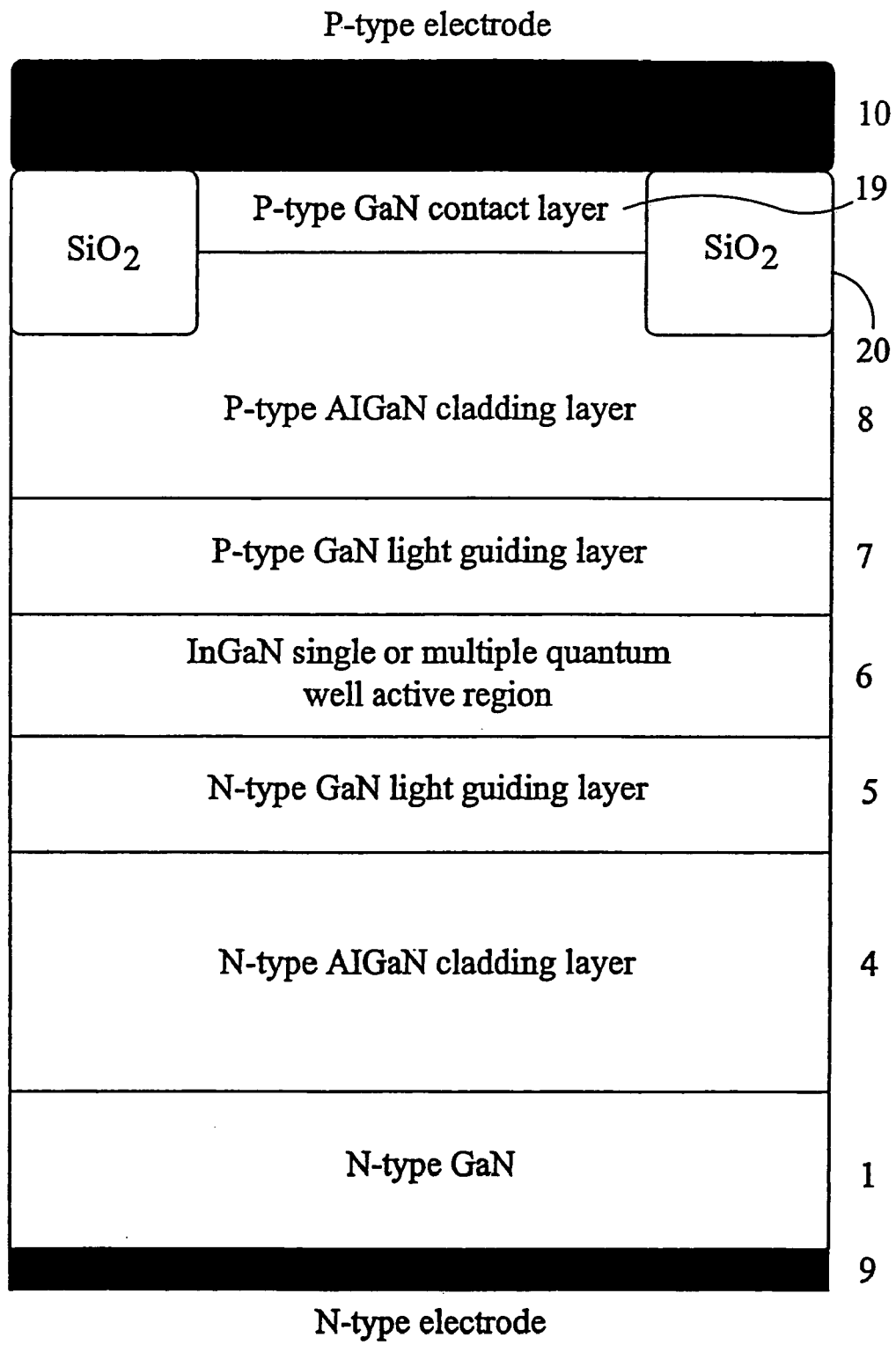
FIG. 6 is a schematic sectional view of the general structure of another semiconductor laser diode fabricated in the (Al, Ga,In)N system by MBE.

FIG. 6 is a schematic cross-section of another continuous wave semiconductor laser diode that can be grown by a method of the invention. The laser diode is generally similar to the laser diode of FIG. 1, except that the first (n-type) contact 9 is not disposed on the same surface of the substrate 1 as the mesa structure. Instead, the mesa structure is grown on a first surface of the substrate 1, and the first (n-type) contact 9 is disposed on a second, opposite surface of the substrate 1. In the laser diode of FIG. 6, the substrate 1 is an n-type doped GaN substrate.

The layers of the mesa structure of the laser diode of FIG. 6 correspond generally to the layers of the mesa structure of the laser diode of FIG. 1, and their description will not be repeated. The active region 6 of the laser diode of FIG. 6 may be, for example, an InGaN single quantum well region, or it may be an InGaN multiple quantum well active region, for example as shown in FIG. 2.

In the embodiments described above the first cladding region, first optical guiding region, second optical guiding region and the second cladding region each consist of a single semiconductor layer. In principle, however, the cladding regions and/or the optical guiding regions could consist of more than a single semiconductor layer.

The invention claimed is:

1. A method of fabricating a semiconductor light-emitting device in the (AI,Ga,In)N materials system, the method comprising:
growing over a first surface of a substrate, in sequence, a first cladding region, a first optical guiding region, an active region, a second optical guiding region and a second cladding region;
wherein the method comprises depositing each of the first cladding region, the first optical guiding region, the active region, the second optical guiding region and the second cladding region by molecular beam epitaxy using ammonia as the nitrogen precursor;
the substrate is a GaN substrate;
the step of growing the active region comprises growing a layer that includes indium;
the active region includes at least one quantum well layer and a plurality of barrier layers in contact with the at least one quantum well layer;
each of the at least one quantum well layer consists of In, Ga and N,
wherein GaN barrier layers are formed between adjacent quantum well layers, and AlGaN barrier layers are formed between the outermost quantum well layers and said first and second optical guiding regions; and
a first electrode is provided on a second surface of the substrate, the second surface of the substrate being opposite to the first surface of the substrate; and
wherein a second electrode is deposited over the second cladding region.

2. A method as claimed in claim 1 wherein the device is a semiconductor laser diode.

3. A method as claimed in claim 2 wherein the device is a continuous wave laser diode.

* * * * *